US008988089B2

(12) United States Patent
Kawahara et al.

(10) Patent No.: US 8,988,089 B2
(45) Date of Patent: Mar. 24, 2015

(54) PIN CARD

(75) Inventors: Takao Kawahara, Tokyo (JP); Takayuki Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 615 days.

(21) Appl. No.: 13/144,792

(22) PCT Filed: Apr. 22, 2010

(86) PCT No.: PCT/JP2010/002901
§ 371 (c)(1),
(2), (4) Date: Jul. 15, 2011

(87) PCT Pub. No.: WO2011/132226
PCT Pub. Date: Oct. 27, 2011

(65) Prior Publication Data
US 2011/0291682 A1    Dec. 1, 2011

(51) Int. Cl.
*G01R 31/20* (2006.01)
*G01R 31/28* (2006.01)

(52) U.S. Cl.
CPC ........ *G01R 31/2851* (2013.01); *G01R 31/2841* (2013.01)
USPC .................................................. 324/754.07

(58) Field of Classification Search
None
See application file for complete search history.

(56) References Cited

U.S. PATENT DOCUMENTS

| 8,547,124 B2 * | 10/2013 | Kawahara et al. ......... 324/750.1 |
| 2004/0145375 A1 * | 7/2004 | Sekino ........................... 324/600 |
| 2006/0072273 A1 | 4/2006 | Hashimoto |

FOREIGN PATENT DOCUMENTS

| JP | 5-107313 | 4/1993 |
| JP | 11-064436 | 3/1999 |
| JP | 2005-151510 | 6/2005 |
| JP | 2007-218779 | 8/2007 |
| JP | 2008-164543 | 7/2008 |
| WO | 2004-104606 | 12/2004 |
| WO | WO 2007043482 A1 * | 4/2007 |

OTHER PUBLICATIONS

Office action for related Japanese Patent Application No. 2011-507490 issued on Jan. 7, 2014 and an English translation.
Written Opinion of the ISA for PCT PCT/JP2010/002901 having an international filed of Apr. 22, 2010.
IPRP for related PCT/JP2010/002091 issued on Oct. 23, 2012 and its English translation.

* cited by examiner

*Primary Examiner* — Paresh Patel
(74) *Attorney, Agent, or Firm* — Ladas & Parry, LLP

(57) ABSTRACT

A first switch is arranged such that a first terminal thereof is connected to an AC test unit and a second terminal thereof is connected to an I/O terminal and a DC test unit. A first switch is configured so as to be capable of switching states between a connection state in which the first terminal and the second terminal are connected to each other, and a disconnection state in which they are disconnected from each other. A bypass capacitor is arranged between the first terminal and the second terminal, and is configured to bypass the frequency component which is cut off by the first switch.

17 Claims, 7 Drawing Sheets

PIN CARD

CROSS REFERENCE TO RELATED APPLICATIONS

This application is the U.S. National Stage of International Patent Application No. PCT/JP2010/002901 filed on Apr. 22, 2010, the disclosure of which is hereby incorporated by reference in its entirety.

BACKGROUND OF THE INVENTION

1. Field of the Invention

The present invention relates to a pin card.

2. Description of the Related Art

A semiconductor test apparatus (which will be referred to simply as the "test apparatus" hereafter) is used to test whether or not a semiconductor device operates normally or to identify defective parts. A typical test apparatus performs an AC test operation and a DC test operation.

In the AC test operation, a test pattern is generated by a pattern generator and a timing generator, and a driver supplies the test pattern thus generated to a device under test (DUT). Upon receiving the pattern signal, the DUT performs predetermined signal processing, and outputs an output signal to the test apparatus. By means of a timing comparator, the test apparatus judges the signal level received from the DUT. By comparing the judgment result with an expected value, the test apparatus judges the quality of the functions of the DUT.

In the DC test operation, a DC test unit supplies a DC voltage or a current signal to the DUT, and the test apparatus tests the DC characteristics such as the input/output impedance of the DUT, the leak current thereof, and so forth.

In many cases, a driver, a timing comparator, and a PMU configured to perform a DC test operation are arranged on a board which is referred to as a pin card (pin electronics card), a digital module, or an interface card, and which is configured such that the board can be removed from the main unit of the test apparatus.

FIG. 1 is a diagram which shows a configuration of a typical pin card. FIG. 1 shows only one channel that corresponds to a given device pin. In practice, several hundreds through several thousands of channels are arranged in parallel.

An I/O terminal Pio of a pin card 200 is connected to a corresponding device pin of a DUT 1 via a cable and an unshown device chuck. The pin card 200 includes two switches (relays) SW1 and SW2, in addition to a driver DR, a timing comparator TCP, and a DC test unit PMU. The switches SW1 and SW2 are used to switch the test mode between the AC test mode and the DC test mode.

When the AC test operation is performed, the switch SW1 is turned on and the switch SW2 is turned off. In this state, the driver DR and the timing comparator TCP are connected to the DUT 1, and the DC test unit PMU is disconnected from the DUT 1.

Conversely, when the DC test operation is performed, the switch SW1 is turned off and the switch SW2 is turned on. In this state, the driver DR and the timing comparator TCP are disconnected from the DUT 1, and the DC test unit PMU is connected to the DUT 1.

In a case in which the frequency of the test pattern is higher than several Gbps, a high-frequency signal having a frequency exceeding several GHz passes through the switch SW1. In this case, as such a switch SW1, there is a need to employ a composite semiconductor switch or MEMS (Micro Electro Mechanical Systems) switch which is capable of transmitting such a high-frequency signal.

However, such a composite semiconductor switch has a very low DC breakdown voltage on the order of 0.1 V. Accordingly, such a composite semiconductor switch cannot be used to handle a test pattern including a DC component. Moreover, although such a MEMS switch satisfies the requirements of such high-speed operation and sufficient DC breakdown voltage, such a MEMS switch has a problem of a high cost. Specifically, the cost of such a MEMS switch is almost 100 times that of other switches. As described above, such a mass-production test apparatus includes several hundreds to several thousands of channels. Accordingly, if MEMS switches are employed in such a test apparatus, it has a strong impact on the cost of the test apparatus.

SUMMARY OF THE INVENTION

The present invention has been made in view of such a situation. Accordingly, it is an exemplary purpose of the present invention to provide a pin card employing low-cost switches.

An embodiment of the present invention relates to a pin card. The pin card comprises: an input/output terminal to be connected to a device under test; an optical semiconductor switch arranged such that a first terminal thereof is connected to an AC test unit configured to perform an AC test operation for the device under test and a second terminal thereof is connected to the input/output terminal and a DC test unit configured to perform a DC test operation for the device under test, and configured to be capable of switching states, between a connection state in which the first terminal and the second terminal are connected to each other, and a disconnection state in which the first terminal and the second terminal are disconnected from each another; and a bypass capacitor arranged between the first terminal and the second terminal, and arranged as an external component of the optical semiconductor switch.

When the AC test operation is performed, the optical semiconductor switch is controlled so as to be set to the connection state. In this operation, the low-frequency component of a test pattern to be supplied to the device under test (or a measurement signal received from the device under test) is passed within the optical semiconductor switch, and the high-frequency component thereof is passed via the bypass capacitor. Using low-cost semiconductor switches, such an embodiment provides a pin card having a wide frequency band, i.e., a pin card configured to be capable of transmitting a high-speed signal.

Also, an arrangement may be made in which, in the DC test operation, the optical semiconductor switch is set to the disconnection state, and the AC test unit is controlled to be set to a silent state.

Also, a pin card according to an embodiment may further comprise a first inductor arranged between the first terminal of the optical semiconductor switch and one terminal of the bypass capacitor; and a second inductor arranged between the second terminal of the optical semiconductor switch and the other terminal of the bypass capacitor. That is to say, the bypass capacitor may be arranged in parallel with the optical semiconductor switch and the first and second inductors.

By providing the first inductor and the second inductor, such an arrangement provides increased impedance of a path including the first switch SW1. With such an arrangement, only signals having a very low frequency pass through the first switch SW1 side, and signals having other frequencies pass through the bypass capacitor side. Thus, such an arrangement reduces the crossover frequency of a path that includes the first switch and a path that includes the bypass capacitor, thereby reducing the level of difficulty in the design. It should be noted that examples of inductors include a ferrite bead inductor.

Also, a pin card according to an embodiment may further comprise: a first resistor arranged in parallel with the first inductor; and a second resistor arranged in parallel with the second inductor.

Also, a pin card according to an embodiment may further comprise a pre-emphasis resistor arranged in series with the bypass capacitor.

Also, the bypass capacitor may be formed using a pattern on, or otherwise a pattern in, a substrate on which the optical semiconductor switch is mounted.

Another embodiment of the present invention relates to a test apparatus. The test apparatus comprises a pin card according to any one of the aforementioned embodiments.

Yet another embodiment of the present invention also relates to a test apparatus. The test apparatus comprises: an input/output terminal to be connected to a device under test; an AC test unit configured to perform an AC test operation for the device under test; a DC test unit configured to perform a DC test operation for the device under test; an optical semiconductor switch arranged such that a first terminal thereof is connected to the AC test unit and a second terminal thereof is connected to the input/output terminal, and configured to be capable of switching states, between a connection state in which the first terminal and the second terminal are connected to each other, and a disconnection state in which the first terminal and the second terminal are disconnected from each another; and a bypass capacitor arranged between the first terminal and the second terminal, and arranged as an external component of the optical semiconductor switch.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
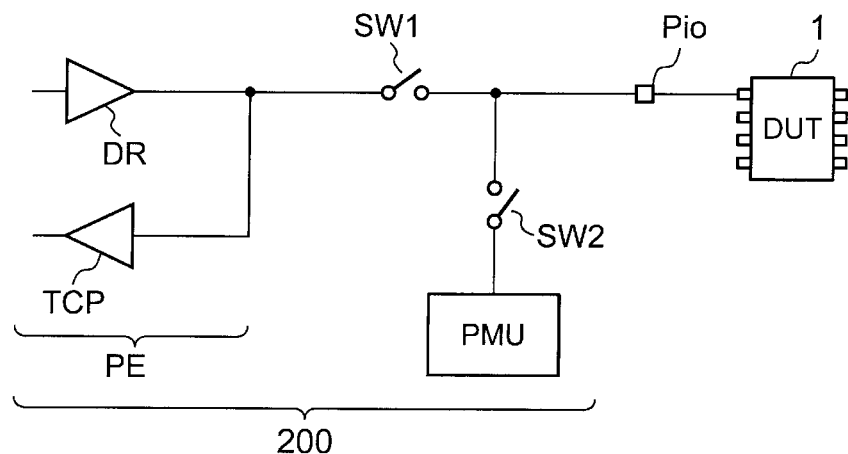
FIG. 1 is a diagram which shows a configuration of a typical pin card.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
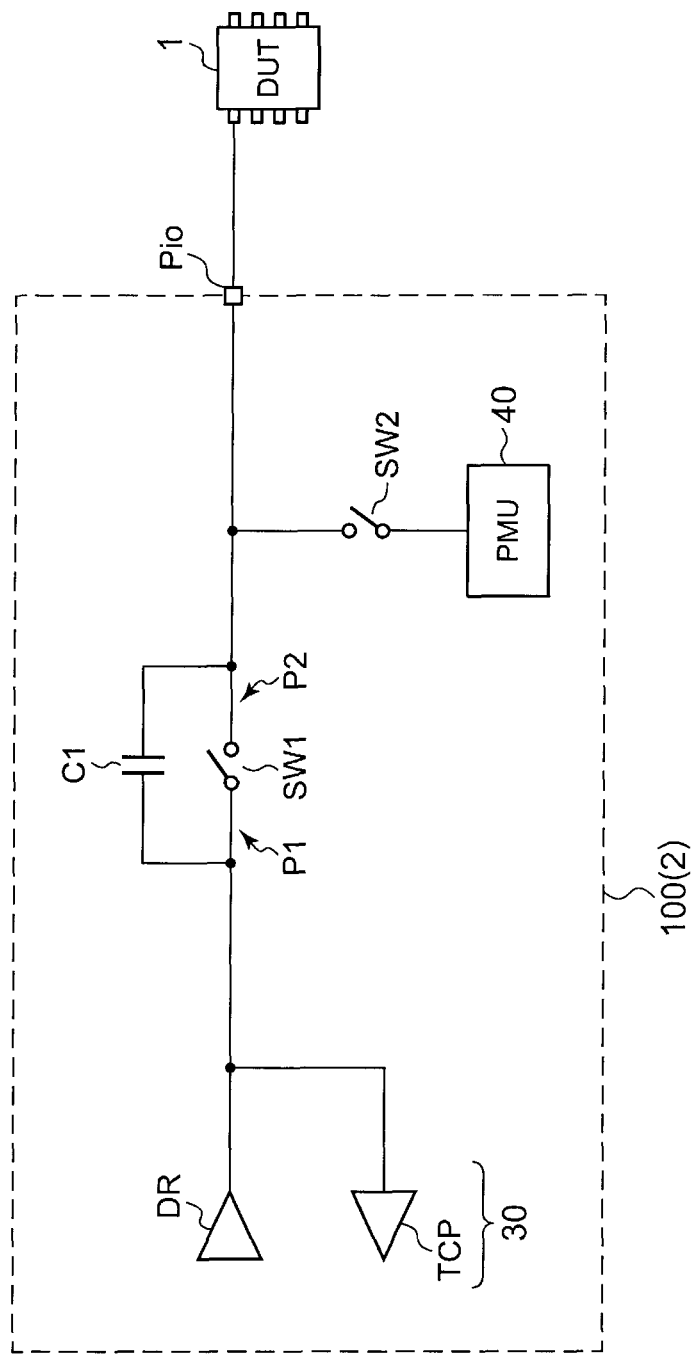
FIG. 2 is a block diagram which shows a configuration of a test apparatus including a pin card according to an embodiment.

FIG. 2 is a block diagram which shows a configuration of a test apparatus 2 including a pin card 100 according to an embodiment. The test apparatus 2 performs an AC test operation and a DC test operation for the DUT 1.

The test apparatus 2 includes the pin card 100 which functions as a front-end for the DUT 1. The pin card 100 is configured to be detachably mounted on a main unit (not shown) of the test apparatus 2, giving consideration to the desired properties of the test apparatus 2 such as high versatility, ease of maintenance, ease of design, etc. An I/O terminal Pio of the pin card 100 is connected to a device pin of a DUT 1 via a device chuck (not shown) and a transmission cable (not shown). FIG. 2 shows only an arrangement for a single channel. However, a test apparatus configured to support a mass-production test operation includes several hundreds to several thousands of channels each having the same configuration.

In the AC test operation, a pattern signal generated by a driver DR is transmitted to the DUT 1, and a timing comparator TCP judges the level of a signal read out from the DUT 1. The level thus judged is compared with an expected value, and the quality of the DUT 1 is judged, or the defective parts are identified, based upon the comparison result. A function block including the driver DR and the timing comparator TCP will be referred to as the "AC test unit 30".

In the DC test operation, a DC test unit (parametric test unit) 40 supplies a DC voltage or a current signal to the DUT 1 so as to test the DC characteristics of the DUT, such as the input/output impedance thereof, the leak current thereof.

The pin card 100 principally includes an AC test unit 30, a DC test unit 40, a first switch SW1, a second switch SW2, and a bypass capacitor C1.

In order to allow the test mode to be switched between an AC test mode and a DC test mode, a first switch SW1 and a second switch SW2 are arranged. In the AC test operation, the first switch SW1 is turned on, and the second switch SW2 is turned off. In the DC test operation, the second switch SW2 is turned on, and the first switch SW1 is turned off.

In order to test high-speed devices that have appeared in recent years, the test apparatus 2 must supply a test pattern to the DUT 1 at a data rate exceeding several Gbps. Such a test pattern passes through the first switch SW1. Accordingly, the first switch SW1 is required to have frequency characteristics that allow a signal to pass through over a wide frequency range from a DC component to a high-frequency band, e.g., several GHz. This is because a first switch SW1 having a narrow bandwidth distorts such a test pattern, leading to a problem in that a desired test operation cannot be performed. It should be noted that only a DC signal passes through the second switch SW2, and accordingly, in principle, the second switch SW2 is not required to have such high-frequency performance.

The above is the outline description of the configuration and functions of the pin card 100. Next, specific description will be made regarding the configuration of the pin card 100.

The first switch SW1 is configured as an optical semiconductor switch, and is arranged between the I/O terminal Pio and the AC test unit 30. Specifically, the first switch SW1 is arranged such that the first terminal thereof is connected to the AC test unit 30 and the second terminal thereof is connected to the I/O terminal Pio. The I/O terminal Pio and the second terminal of the first switch SW1 are connected to the DC test unit 40 via the second switch SW2.

The first switch SW1 is configured so as to be capable of switching states between a connection state and a disconnection state with respect to a path between the first terminal and the second terminal. The first switch alone is capable of passing a signal at a frequency of 1 GHz or less.

The bypass capacitor C1 is arranged as an external component of the first switch SW1 between the first terminal P1 and the second terminal P2. The capacitance of the bypass capacitor C1 is determined so as to allow the frequency component that is higher than the cutoff frequency of the first switch SW1 to pass through, and is preferably determined to be 2 pF to 10 µF. If a bypass capacitor C1 having a capacitance of approximately 5 pF or more is employed, such a bypass capacitor C1 is capable of passing a signal having a frequency of 500 MHz or more. If a bypass capacitor C1 having a capacitance greater than 5 pF or more is employed, such a bypass capacitor C1 is capable of passing signals having lower frequencies. If such an arrangement does not require such a wide bandwidth, a sufficient capacitance is on the order of 2 pF.

The bypass capacitor C1 may be provided as a chip component, or may be formed using a pattern formed on, or formed in, a substrate on which the first switch SW1 is mounted.

The above is the configuration of the pin card 100. Next, description will be made regarding the operation thereof.

In the DC test operation, the second switch SW2 is turned on and the first switch SW1 is turned off. Furthermore, the AC test unit 30 is controlled such that it does not generate a signal that can pass through the bypass capacitor C1 (silent state). Specifically, the driver DR should be set to a disenable state in which it outputs a voltage at a predetermined constant level. Alternatively, the output of the driver DR should be set to the high-impedance state.

As a result, the DC test unit 40 is connected to the DUT 1 via the second switch SW2, thereby measuring the DC characteristics of the DUT 1. In this state, a path between the AC test unit 30 and the I/O terminal Pio is DC-electrically cut off. Furthermore, the AC test unit 30 generates no AC signal (high-frequency signal). Thus, in this state, no AC signal is mixed with the signal input to the DC test unit 40.

On the other hand, when the AC test operation is performed, the first switch SW1 is turned on, and the second switch SW2 is turned off. Among the signals transmitted from the driver DR, the high-frequency components, e.g., the signals having a frequency which is equal to or higher than 500 MHz, are supplied to the DUT 1 via the bypass capacitor C1. On the other hand, the low-frequency components, e.g., the signals having a frequency which is equal to or lower than 500 MHz, are supplied to the DUT 1 via the first switch SW1.

The above is the operation of the pin card 100. With the pin card 100, the first switch SW1 allows the low-frequency component to pass through, and the bypass capacitor C1 allows the high-frequency component to pass through. Accordingly, such an arrangement requires the first switch SW1 alone to have a cutoff frequency fc of only 500 MHz or more. Thus, such an arrangement provides such an AC test operation at a rate of several Gbps using low-cost optical semiconductor switches.

Furthermore, such an arrangement does not require a high-cost MEMS switch, thereby dramatically reducing the cost of the test apparatus 2 as compared with conventional arrangements. This advantage becomes very obvious in a test apparatus including several thousands of channels configured to support mass-production test operation.

With such a pin card 100 shown in FIG. 2, the bypass capacitor C1 can be regarded as a high-pass filter, and the first switch SW1 can be regarded as a low-pass filter. The crossover frequency of the bypass capacitor C1 and the first switch SW1 is on the order of several hundred MHz to several GHz. Such a frequency band has a significant effect on the waveform of the signal transmitted or received between the DUT 1 and the test apparatus 2. Accordingly, this results in severe design conditions for the pass-through characteristics and phase characteristics of the bypass capacitor C1 and the first switch SW1 around the crossover frequency.

In contrast, by designing the crossover frequency to be lower, such an arrangement is capable of relaxing such severity in the design conditions.

Figure 3:
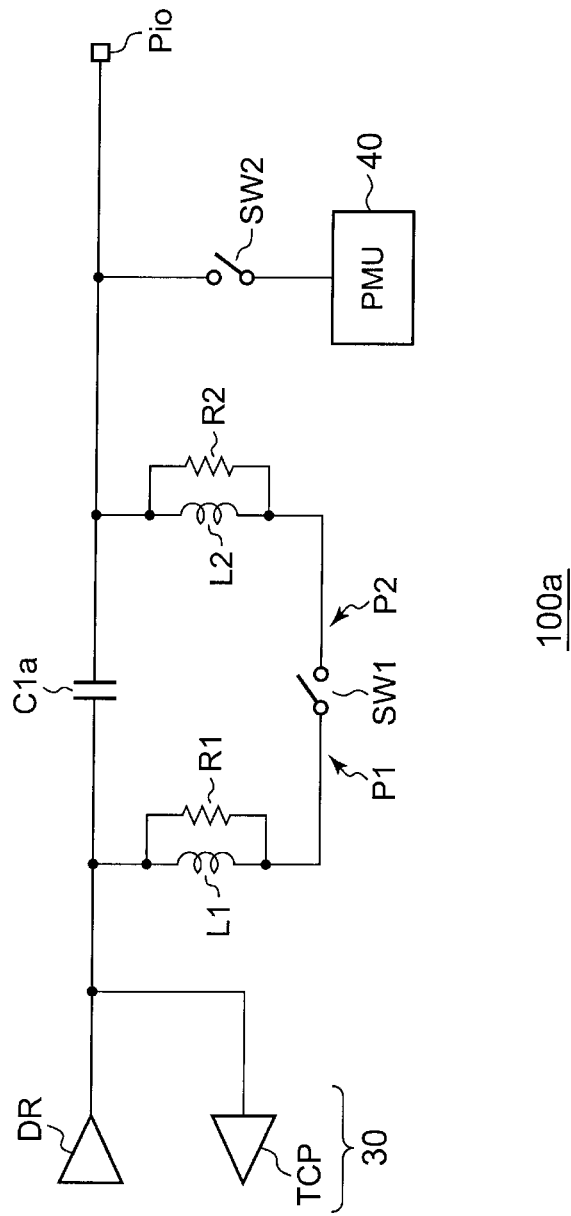
FIG. 3 is a block diagram which shows a configuration of a pin card according to a modification.

FIG. 3 is a block diagram which shows a configuration of a pin card 100a according to a modification. In the pin card 100a shown in FIG. 3, the crossover frequency is designed to be lower as compared with the pin card 100 shown in FIG. 2. Specifically, the crossover frequency is set to be on the order of several kHz to several MHz.

With the pin card 100a shown in FIG. 3, the first switch SW1 itself has a pass band of DC to 1 GHz. However, with such an arrangement, the crossover frequency is intentionally reduced to several kHz to several MHz. Accordingly, the pin card 100a further includes a first inductor L1, a second inductor L2, a first resistor R1, and a second resistor R2, in addition to the components shown in FIG. 2.

The first inductor L1 is arranged between the first terminal P1 of the first switch SW1 and the AC test unit 30. The second inductor L2 is arranged between the second terminal P2 of the first switch SW1 and the input/output terminal Pio. The first inductor L1 and the second inductor L2 each may be configured as a typical inductor, or each may be configured as a ferrite bead inductor (coil). The inductance values of the first inductor L1 and the second inductor L2 should be designed such that signals having frequencies higher than the crossover frequency do not leak to the first switch SW1 side.

The first resistor R1 is arranged in parallel with the first inductor L1. The second resistor R2 is arranged in parallel with the second inductor L2.

The first resistor R1 and the second resistor R2 are arranged in order to adjust the Q value of the circuit. It should be noted that, in a case in which the necessary Q value can be obtained without involving the first resistor R1 and the second resistor R2, the first resistor R1 and the second resistor R2 may be eliminated.

The bypass capacitor C1 is connected so as to bypass the first inductor L1, the first switch SW1, and the second inductor L2. In the pin card 100a shown in FIG. 3, the capacitance of the bypass capacitor C1 is preferably set in a range between 100 pF and 10 µF in order to allow signals having frequencies of several MHz or more to pass through the bypass capacitor C1 side.

Figure 4:
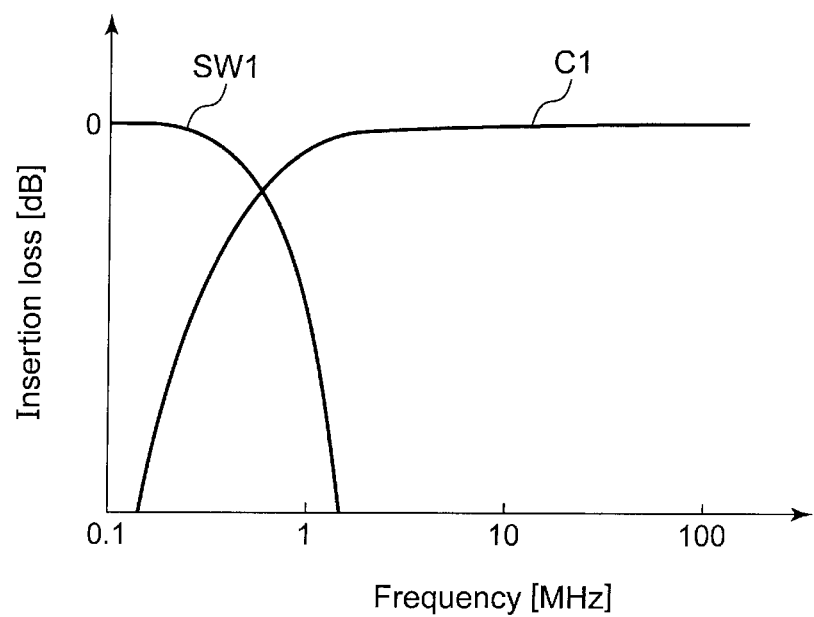
FIG. 4 is a graph which shows the crossover frequency of the pin card shown in FIG. 3.

FIG. 4 is a graph which shows the crossover frequency of the pin card 100a shown in FIG. 3. It can be understood that signals having frequencies higher than 1 MHz pass through the bypass capacitor C1 side, and signals having a frequency that is equal to or lower than 1 MHz pass through the first switch SW1.

The frequency components around a range between several kHz and several MHz to be set for the crossover frequency have almost no effect on the waveform of a signal transmitted or received between the DUT1 and the test apparatus 2. Thus, such an arrangement dramatically simplifies the circuit design, as compared with an arrangement shown in FIG. 2.

In a case in which the crossover frequency is designed to be higher, i.e., to be on the order of several hundred MHz to several GHz, in such a modification shown in FIG. 3, the capacitance of the bypass capacitor C1 should be designed to be on the order of 1 PF to 100 pF.

That is to say, the capacitance of the bypass capacitor C1 should be appropriately selected from a range between 1 pF to 10 µF according to the required crossover frequency.

Figure 5:
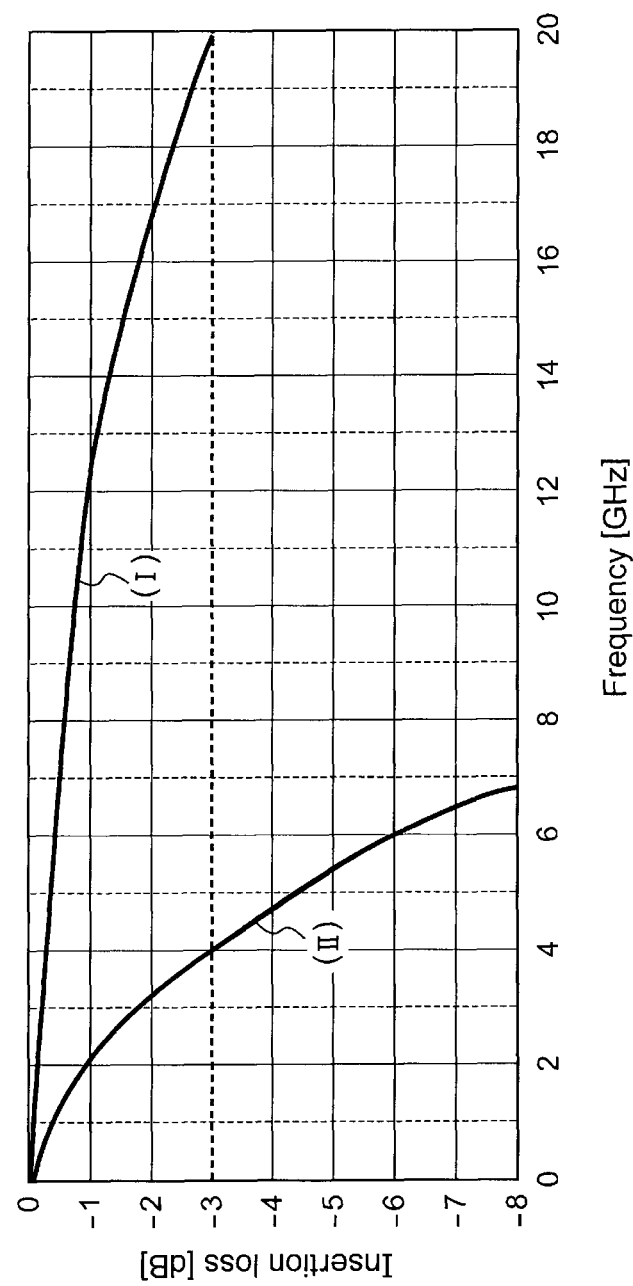
FIG. 5 is a graph which shows the pass-through characteristics of the pin card shown in FIG. 3.

FIG. 5 is a graph which shows the pass-through characteristics of the pin card 100a shown in FIG. 3. The characteristics (I) represent the pass-through characteristics of the pin card 100a shown in FIG. 3, and the characteristics (II) represent the pass-through characteristics of the optical semiconductor switch alone. As represented by the characteristics (II), an arrangement having no bypass capacitor C1 only provides a cutoff frequency on the order of 4 GHz. In contrast, by providing the bypass capacitor C1, such an arrangement provides a cutoff frequency that is equal to or higher than 15 GHz.

Figure 6:
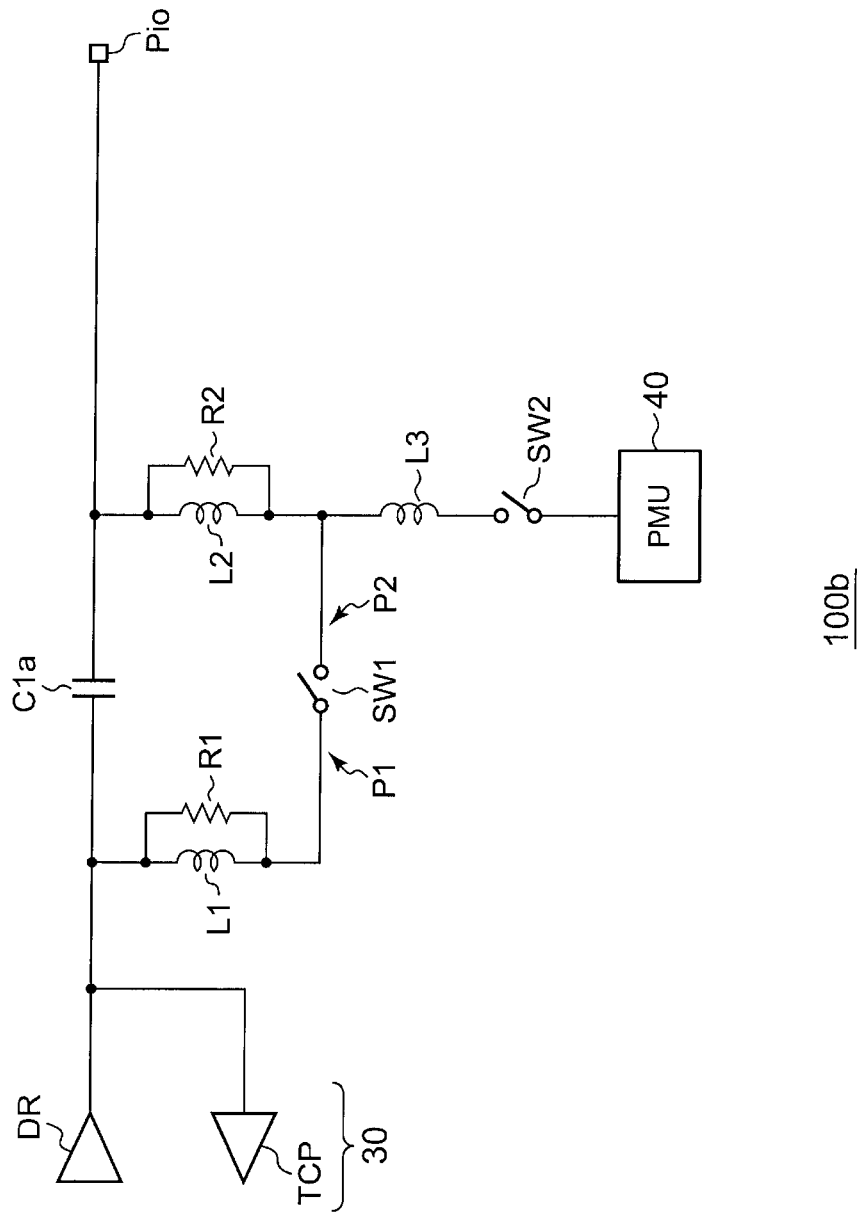
FIG. 6 is a block diagram which shows a configuration of a pin card according to another modification.

FIG. 6 is a block diagram which shows a configuration of a pin card 100b according to another modification. The point of difference between the pin card 100b shown in FIG. 6 and the pin card shown in FIG. 3 is the position at which the DC test unit 40 is arranged.

That is to say, the DC test unit 40 is not connected to the I/O terminal Pio, but is connected to a connection node (second terminal P2 of the first switch SW1) that connects the second inductor L2 and the first switch SW1. Such an arrangement suitably prevents high-frequency signals from being input to the DC test unit 40, as compared with an arrangement shown in FIG. 3.

Furthermore, a third inductor L3 is arranged between the second switch SW2 and the second terminal P2. By providing the third inductor L3, such an arrangement further suppresses such high-frequency signals being input to the DC test unit 40.

Figure 7:
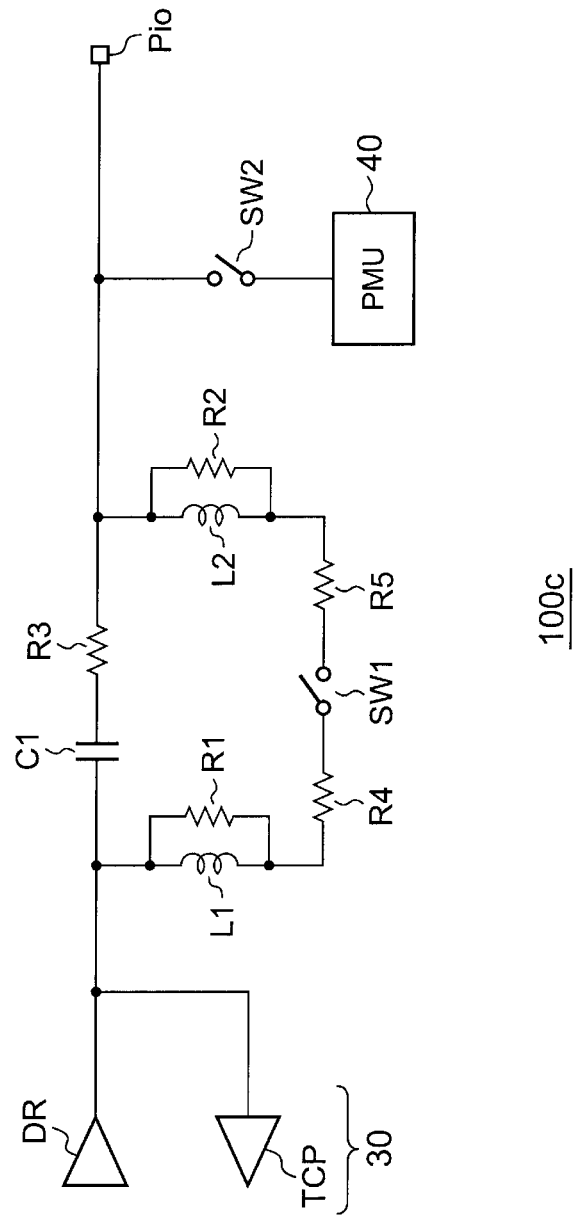
FIG. 7 is a block diagram which shows a configuration of a pin card according to a yet another embodiment.

FIG. 7 is a block diagram which shows a configuration of a pin card 100c according to yet another modification. In some cases, the test apparatus includes a pre-emphasis circuit (high-frequency emphasis filter) in order to compensate for distortion of the waveform of a test pattern that occurs in a transmission line. The pin card 100c shown in FIG. 7 further includes a high-frequency emphasis resistor R3 arranged in parallel with the bypass capacitor C1 in order to provide such a pre-emphasis function. By providing the high-frequency emphasis resistor R3 and the bypass capacitor C1, such an arrangement emphasizes the high-frequency component. The on-resistance of a relay or a switch may be employed as such a pre-emphasis resistor R3.

Also, a pre-emphasis capacitor and a pre-emphasis resistor may be arranged in series so as to form a path in parallel with a path comprising the bypass capacitor C1 and the pre-emphasis resistor R3 shown in FIG. 7.

Furthermore, the pin card 100c includes a fourth resistor R4 and a fifth resistor R5 arranged in series with the first switch SW1. By providing the fourth resistor R4 and the fifth resistor R5, such an arrangement allows the Q value of the circuit to be adjusted. It should be noted that, in a case in which the required Q value can be obtained without the fourth resistor R4 and the fifth resistor R5, such additional components can be eliminated. Also, the on-resistance of the first switch SW1 may be used as such a fourth resistor R4 and fifth resistor R5.

Description has been made regarding the present invention with reference to the embodiments. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made regarding an arrangement in which the first switch SW1 and the bypass capacitor C1 are mounted on the pin card 100. However, the present invention is not restricted to such an arrangement. That is to say, the optical semiconductor switch 10 and the peripheral circuit thereof are not necessarily configured in the manner of the pin card having a configuration such that it is detachably mounted on the main unit of the test apparatus. Also, the optical semiconductor switch 10 and the peripheral circuit thereof may be integrally configured together with other circuit blocks.

Description has been made regarding an arrangement in which an optical semiconductor switch is employed as the first switch SW1. However, the present invention is not restricted to such an arrangement. Also, a different low-cost switch may be employed.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A pin card comprising:
   an input/output terminal to be connected to a device under test;
   an optical semiconductor switch arranged such that a first terminal thereof is connected to an AC test unit configured to perform an AC test operation for the device under test and a second terminal thereof is connected to the input/output terminal and a DC test unit configured to perform a DC test operation for the device under test, and configured to be capable of switching states, between a connection state in which the first terminal and the second terminal are connected to each other, and a disconnection state in which the first terminal and the second terminal are disconnected from each another;
   a bypass capacitor arranged between the first terminal and the second terminal, and arranged as an external component of the optical semiconductor switch;
   a first inductor arranged between the first terminal of the optical semiconductor switch and one terminal of the bypass capacitor; and
   a second inductor arranged between the second terminal of the optical semiconductor switch and the other terminal of the bypass capacitor.

2. The pin card according to claim 1, wherein the capacitance of the bypass capacitor is set in a range between 2 pF and 10 μF.

3. The pin card according to claim 1, further comprising:
a first resistor arranged in parallel with the first inductor; and
a second resistor arranged in parallel with the second inductor.

4. The pin card according to claim 1, wherein the capacitance of the bypass capacitor is set in a range between 1 pF and 10 μF.

5. The pin card according to claim 1, further comprising a pre-emphasis resistor arranged in series with the bypass capacitor.

6. The pin card according to claim 1, further comprising a pre-emphasis resistor and a capacitor arranged in series so as to form a path in parallel with the bypass capacitor.

7. The pin card according to claim 1, wherein the bypass capacitor is formed using a pattern on, or otherwise a pattern in, a substrate on which the optical semiconductor switch is mounted.

8. A test apparatus comprising a pin card according to claim 1.

9. A test apparatus comprising:
an input/output terminal to be connected to a device under test;
an AC test unit configured to perform an AC test operation for the device under test;
a DC test unit configured to perform a DC test operation for the device under test;
an optical semiconductor switch arranged such that a first terminal thereof is connected to the AC test unit and a second terminal thereof is connected to the input/output terminal, and configured to be capable of switching states, between a connection state in which the first terminal and the second terminal are connected to each other, and a disconnection state in which the first terminal and the second terminal are disconnected from each another;
a bypass capacitor arranged between the first terminal and the second terminal, and arranged as an external component of the optical semiconductor switch;
a first inductor arranged between the first terminal of the optical semiconductor switch and one terminal of the bypass capacitor; and
a second inductor arranged between the second terminal of the optical semiconductor switch and the other terminal of the bypass capacitor.

10. The pin card according to claim 1, wherein, in the DC test operation, the optical semiconductor switch is set to the disconnection state, and the AC test unit is set to a silent state.

11. The test apparatus according to claim 9, wherein, in the DC test operation, the optical semiconductor switch is set to the disconnection state, and the AC test unit is set to a silent state.

12. The test apparatus according to claim 9, wherein the capacitance of the bypass capacitor is set in a range between 2 pF and 10 μF.

13. The test apparatus according to claim 9, further comprising:
a first resistor arranged in parallel with the first inductor; and
a second resistor arranged in parallel with the second inductor.

14. The test apparatus according to claim 9, wherein the capacitance of the bypass capacitor is set in a range between 1 pF and 10 μF.

15. The test apparatus according to claim 9, further comprising a pre-emphasis resistor arranged in series with the bypass capacitor.

16. The test apparatus according to claim 9, further comprising a pre-emphasis resistor and a capacitor arranged in series so as to form a path in parallel with the bypass capacitor.

17. The test apparatus according to claim 9, wherein the bypass capacitor is formed using a pattern on, or otherwise a pattern in, a substrate on which the optical semiconductor switch is mounted.

* * * * *